US008468398B2

(12) United States Patent
Jiang et al.

(10) Patent No.: US 8,468,398 B2
(45) Date of Patent: Jun. 18, 2013

(54) LOOPBACK TESTING WITH PHASE ALIGNMENT OF A SAMPLING CLOCK AT A TEST RECEIVER APPARATUS

(75) Inventors: Kunlun Kenny Jiang, Richmond Hill (CA); Nancy Ngar Sze Chan, Markham (CA)

(73) Assignee: Advanced Micro Devices, Inc., Austin, TX (US)

( * ) Notice: Subject to any disclaimer, the term of this patent is extended or adjusted under 35 U.S.C. 154(b) by 337 days.

(21) Appl. No.: 13/010,408

(22) Filed: Jan. 20, 2011

(65) Prior Publication Data

US 2012/0192043 A1  Jul. 26, 2012

(51) Int. Cl.
*G01R 31/28* (2006.01)

(52) U.S. Cl.
USPC ........................................................ 714/717

(58) Field of Classification Search
USPC ............. 714/48, 717, 724, 746, 799; 375/355
See application file for complete search history.

(56) References Cited

U.S. PATENT DOCUMENTS 7,672,406 B2 * 3/2010 Takeuchi ...................... 375/345
2004/0205416 A1 * 10/2004 Shirota ........................... 714/48

OTHER PUBLICATIONS

Graham et al., Circular BIST testing the digital logic within a high speed SERDES, 2003, ITC International test conference, paper 47.2, p. 1221-1228.*
Moreno et al., Compackt frequency offset circuit for testing IC RF transceivers, 2006, IEEE, p. 1-4.*

* cited by examiner

*Primary Examiner* — Shelly A Chase
(74) *Attorney, Agent, or Firm* — Ingrassia Fisher & Lorenz, P.C.

(57) ABSTRACT

Methods and test receiver apparatus are provided for loopback testing of a unidirectional physical layer device. The disclosed methods and test receiver apparatus allow for the phase of a sampling clock implemented at the test receiver apparatus to be aligned with the phase of a test data signal.

20 Claims, 4 Drawing Sheets

LOOPBACK TESTING WITH PHASE ALIGNMENT OF A SAMPLING CLOCK AT A TEST RECEIVER APPARATUS

TECHNICAL FIELD

Embodiments of the subject matter described herein relate generally to testing operability of a device. More particularly, embodiments of the subject matter relate to loopback testing of a unidirectional physical layer device with phase alignment of a sampling clock implemented at a test receiver apparatus.

BACKGROUND

Loopback testing is often used to confirm operability of transmit and/or receive circuits within signal transceivers. In a typical loopback testing arrangement, a pseudorandom bit sequence (PRBS) generator delivers a sequence of test data values to the transmit circuit. The transmit circuit outputs a corresponding test data signal onto a signal path. The signal path is looped-back to the input of a receiver circuit. The receiver circuit may include a sampling flip-flop, that is driven by a sampling clock, to sample the test data signal. In particular, the sampling flip-flop samples the incoming test data signal (according to the timing of the sampling clock) to generate a sequence of received data values. The test data sequence of the test data signal and the received data sequence can then be compared bit-for-bit to confirm whether or not there is error-free signal transmission and reception. If bit errors are not detected, this means that the received data sequence corresponds to the original test data sequence of the test data signal, and that the result of the loopback test is no error. If bit errors) are detected, an error can be signaled to indicate a mismatch between the test data sequence of the test data signal and the received data sequence.

For a loopback testing to work correctly, the sampling clock that drives the sampling flip-flop should ideally be phase aligned with respect to the test data signal that is being used to perform loopback testing. However, this can become problematic when the loopback data path is relatively long and/or different output driver modes need to be supported. Either factor can result in large round-trip delay variation. This is especially true in high data rate systems (e.g., those with a data rate of 5.4 Gigabytes per second or greater) since the timing margin left to meet setup and hold time requirements of sampling flip-flop is limited.

In addition, variations in the fabrication process used to manufacture the transmitter can also make it difficult to phase align the sampling clock (that drives the sampling flip-flop) with respect to the test data signal.

In some complex devices, such as transceivers that have a high-speed bi-directional interface between a transmitter and a receiver for loopback testing, a clock recovery circuit or digital-to-analog converter (DAC)-controlled phase interpolator can be provided at the receiver. For example, in some implementations, a clock recovery circuit used at a receiver can include a digital-to-analog converter (DAC)-controlled phase interpolator to accurately align the sampling phase of the sampling clock with respect to the phase of the test data signal.

Another option for loopback testing is to employ an external high-speed test receiver. Some external high-speed test receivers include a clock recovery circuit or adjustable chain of delay elements in series with sampling clock that can be used to align the phase of the sampling clock with respect to the phase of the test data signal. The external high-speed test receiver can be less desirable since it is a separate piece of equipment that is not integrated as part of the device, and adds additional cost and complexity when implementing loopback testing.

With other types of devices, such as uni-directional physical layer devices that have a transmitter only, a test receiver can be implemented to perform loopback testing with respect to the transmitter. However, it may be undesirable to incorporate a dedicated clock recovery circuit at the test receiver for the sole purpose of testing the functionality of the transmit path. For example, it may be cost prohibitive or impractical due to the relatively limited die area and increased design complexity. This is particularly true when the test receiver is implemented as an internal, on-die component that is integrated with the device since the available die area that can be used to implement the test receiver is limited, which makes inclusion of a clock recovery circuit undesirable in many devices.

BRIEF SUMMARY OF EMBODIMENTS

It would be desirable to provide a low-cost test receiver architecture that can be incorporated internally with a uni-directional physical layer device to enable internal loopback testing without the need for a clock recovery circuit. It would also be desirable to provide an alternative mechanism for accurately positioning or aligning phase of the sampling clock (that is used to sample the test data signal) with respect to the phase of the test data signal even when the device being tested or the conditions under which it is being tested vary, such as when there are device process variations, different operating data rates and different capacitive loading conditions.

In accordance with one embodiment, a loopback testing method is provided in which a plurality of clock signals are generated that each have a different phase and are in quadrature with each other. A test data signal is received and sampled to generate a sampled test data signal. The sampled test data signal is compared to a known test data pattern, and an error detection output signal is generated whenever a bit error is detected in the sampled test data signal. Based on one or more instances of the error detection output signal, a phase selection control signal is generated that is used to select a particular one of the plurality of clock signals as a sampling clock signal. The particular one of the plurality of clock signals that is selected depends on a value of the phase selection control signal. The value of the phase selection control signal varies based on a number of instances of the error detection output signal that were generated within a test time. One of the plurality of clock signals that is selected will have a phase that is substantially aligned with respect to the phase of the received test data signal. The received test data signal can then subsequently be sampled based on the sampling clock signal to generate another sampled test data signal that is substantially phase-aligned with respect to the received test data signal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

Furthermore, the connecting lines shown in the various figures contained herein are intended to represent example functional relationships and/or physical couplings between the various elements. It should be noted that many alternative or additional functional relationships or physical connections may be present in an embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

Figure 1:
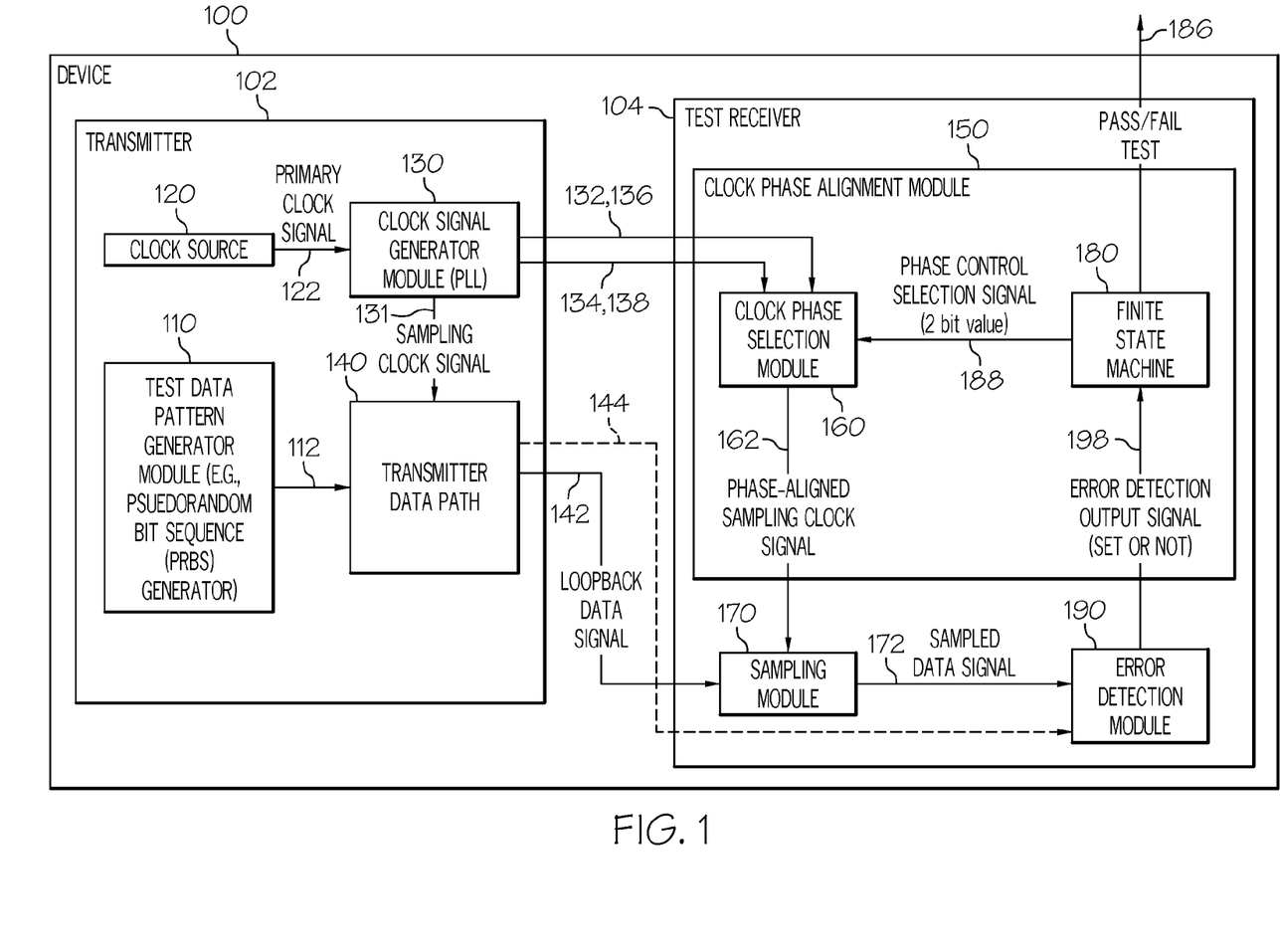
FIG. 1 is a block diagram of an exemplary integrated circuit device having a loopback testing system in accordance with some of the disclosed embodiments.

FIG. 1 is a block diagram of an exemplary integrated circuit device 100 having a loopback testing system in accordance with some of the disclosed embodiments. In some implementations, the integrated circuit device 100 can be an integrated circuit with a high speed serialized interface such as a uni-directional physical layer device with a high-speed serial interface, such as a specialized microprocessor such as an Accelerated Processing Unit (APU) or graphics processing unit (GPU) or the like.

The integrated circuit device 100 includes a transmitter 102, and a "loopback" test receiver 104 that can be implemented internally as part of the integrated circuit device 100.

The transmitter 102 includes a clock source 120 that generates a primary clock signal 122, a test data pattern generator module 110 that generates test data signal 112 having a known test data pattern, and a clock signal generator module 130 that generates clock signals. The clock signal generator module 130 passes a sampling clock signal 131 that is generated from the primary clock signal 122 along to a transmitter data path 140. The transmitter data path 140 also receives the test data signal 112, which has a known test data pattern. The known test data pattern of the test data signal can generally be any known, predictable and commonly used test data pattern. Examples of known test data patterns include a ramp test data pattern, which is an incrementing data pattern, a pseudo-random bit sequence (PRBS) pattern, which is a predictable random data pattern such as those generated by well-known PRBS7.0 and PRBS10.0 algorithms. For instance, the well-known PRBS7.0 pattern generates pseudo-random data according to the polynomial:

$$y=x^7+x^6+1.$$

The known test data pattern can have different lengths depending on the algorithm used to generate it.

The transmitter data path module 140 generates a test (or "loopback") data signal 142 that includes the known test data pattern clocked in accordance with the primary clock signal 122. The transmitter data path module 140 can include any well-known elements that can present in a transmitter data path. For instance, in one particular non-limiting implementation, the transmitter data path module 140 can include elements (not illustrated) such as a serializer, retime flip-flops, a driver with equalization, etc. In such an implementation, the sampling clock signal 131 can be used at the transmitter data path module 140 to retime the serialized data with a flip flop (not illustrated) at clock frequency equal to the data rate for the purpose of removing static inter-symbol interference and static jitter due to mismatches in the serializer (not illustrated).

The transmitter data path 140 introduces a delay to the test data signal 142 which can introduce phase error that potentially impacts the timing and phase of the test data signal 142. This delay can have a large variance depending on factors such as output loading, fabrication process, supply voltage, and operating temperature. The transmitter data path 140 transmits the test data signal 142 to the test receiver 104 over a uni-directional test data path 144. The test receiver 104 is generally a data recovery circuit, and in one implementation is an internal part of the integrated circuit device 100.

As noted above, prior to transmission of the test data signal 142 over the uni-directional test data path 144, phase error can be introduced which impacts the timing and phase of the test data signal 142, and in this case, the test receiver 104 does not include its own clock recovery circuitry that can be used to recover from phase errors that can be introduced.

In accordance with the disclosed embodiments, the clock signal generator module 130 also generates a plurality of clock signals 132/136, 134/138 based on the primary clock signal 122, and provides these clock signals to the test receiver 104 so that it can correct any phase error that is introduced. This allows for the phase of the clock signal 162 that is used to sample the test data signal 142 to be correctly substantially aligned. These clock signals 132/136, 134/138 each have a different phase, and in some implementations, such as that illustrated in FIG. 1, are two pairs of differential clock signals 132/136, 134/138 that are "in quadrature" with respect to each other (e.g., 90 degrees out-of-phase with each other).

Figure 2:
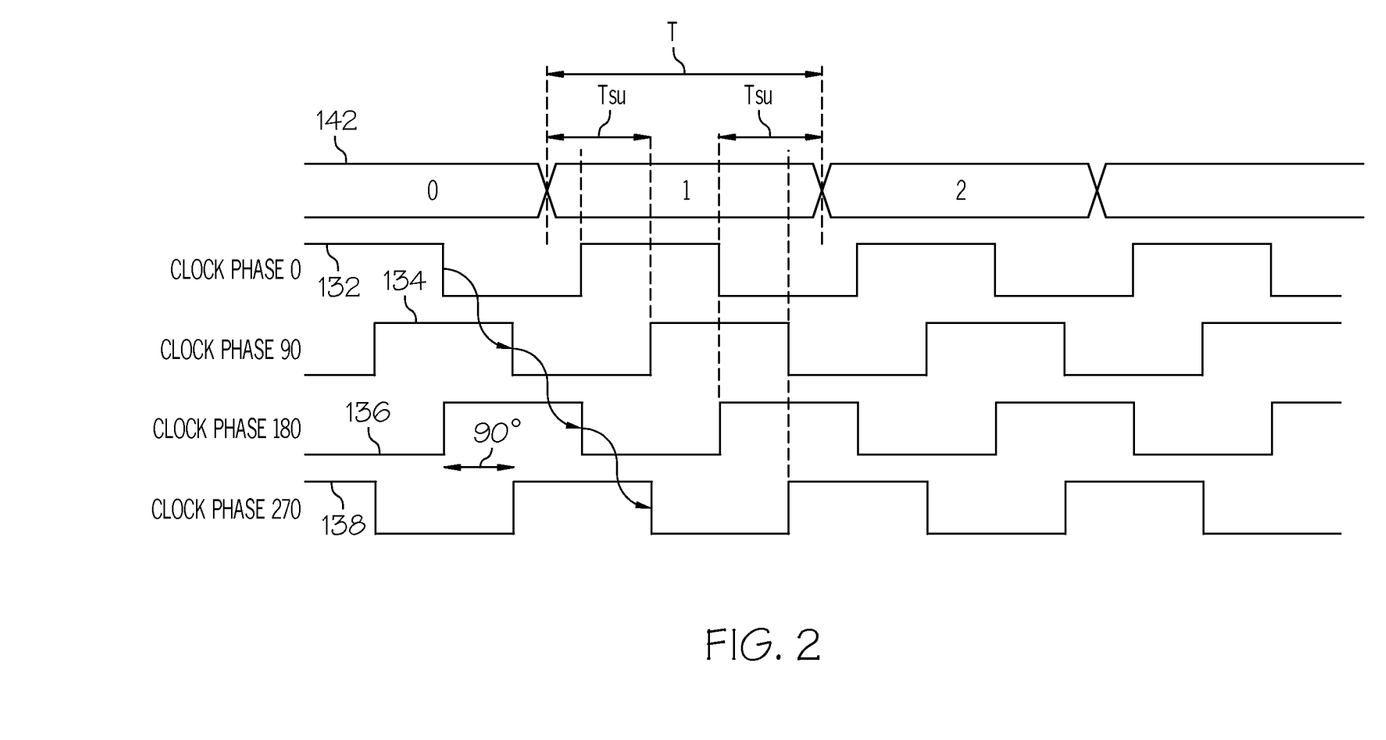
FIG. 2 is a timing diagram that shows an example of a plurality of clock signals and a received test data signal.

FIG. 2 is a timing diagram that shows an example of a plurality of clock signals 132, 134, 136, 138 that are in quadrature with each other along with the test data signal 142.

As shown in FIG. 2, the plurality of clock signals 132/136, 134/138 comprise a first pair of differential clock signals 132/136, and a second pair of differential clock signals 134/138. The first pair of complementary or differential clock signals 132/136 includes a first in-phase clock signal 132 that is in-phase with the primary clock signal 122, and a first complementary clock signal 136 that is complementary to the first in-phase clock signal 132 and is thus 180 degrees out-of-phase with the primary clock signal 122. The second pair of differential clock signals 134/138 includes a first quadrature-phase clock signal 134 that is 90 degrees out-of-phase with the primary clock signal 122, and a second complementary clock signal 138. The second complementary clock signal 138 is complementary to the first quadrature-phase clock signal 134 (i.e., 180 degrees out-of-phase with the first quadrature-phase clock signal 134), and is 270 degrees out-of-phase with the primary clock signal 122.

The test receiver 104 includes a sampling module 170, an error detection module 190 and a clock phase alignment module 150.

The sampling module 170 regularly samples the test data signal 142 in accordance with a clock signal 162 from the clock phase alignment module 150 to generate a sampled test data signal 172.

The error detection module 190 compares each bit of the sampled test data signal 172 to a corresponding bit of a known test data pattern (that is the same as the test data pattern of the test data signal 112 generated by test data pattern generator module 110 of the transmitter 102), and generates the error detection output signal 192 in response to one or more bit errors detected in the sampled test data signal 172. The number of bit errors that need to be detected in order to unlatch the error detection module 190 and output the error detection output signal 192 varies depending on the implementation. For example, in some implementations, more than one bit error needs to be detected to trigger the error detection output signal 192. For instance, the number of erroneous bits detected can be counted and compared against a threshold, such that the error detection output signal 192 is set only when bit error count is over the threshold (i.e., X erroneous bits are detected). By contrast, in one low cost implementation, detection of one bit error can be used to trigger the error detection output signal 192. In other words, any one erroneous bit detected will be latched and set the error detection output signal 192.

The clock phase alignment module 150 selects, based on a phase selection control signal 188, a particular one of the clock signals 132/136, 134/138 that has a phase that is substantially aligned with respect to the test data signal 142 as a sampling clock signal 162 that is to be used to sample the test data signal 142. In one implementation, the clock phase alignment module 150 includes a finite state machine 180, and a clock phase selection module 160. The finite state machine 180 generates a phase selection control signal 188 in response to the error detection output signal 198. In one implementation, the finite state machine 180 generates a phase selection control signal 188 whenever the error detection output signal 198 is set, whereas in other implementations, the finite state machine 180 generates the phase selection control signal 188 on a regular basis, and the phase selection control signal 188 provides an indication of the number of times the error detection output signal 198 was set in a particular period of time.

The clock phase selection module 160 receives the clock signals 132/136, 134/138, and the phase selection control signal 188. The phase selection control signal 188 is designed to control the clock phase selection module 160 such that the clock phase selection module 160 selects and outputs the particular one of the clock signals 132/136, 134/138 that has a phase that is substantially phase-aligned with respect to the test data signal 142. In other words, depending on the value of the phase selection control signal 188, the phase selection control signal 188 will cause the clock phase selection module 160 to output (as the sampling clock signal 162) the correct one of the clock signals 132/136, 134/138 that has its phase that is substantially aligned with respect to phase of the test data signal 142.

In one exemplary implementation, the phase selection control signal 188 is two-bit binary control signal that can be used to select among four different phase settings, as specified in Table 1 below. It is noted that the correspondence between counter value (column 1) and the clock signal (column 3) can be arbitrarily set so long as each counter value (column 1) corresponds to a different clock signal having a different phase.

TABLE 1

| Phase Counter Value | Corresponding Binary Value of the Phase Selection Control Signal | Clock Signal (FIG. 2) That Is Output By Clock Phase Selection Module 160 |
| --- | --- | --- |
| 1 | 00 | 132 |
| 2 | 01 | 134 |
| 3 | 10 | 136 |
| 4 | 11 | 138 |

As shown in Table 1, the corresponding binary value of the phase selection control signal 188 output by the finite state machine 180 is 00 when the phase counter value is one (1) (i.e., when one instance of the error detection output signal 198 was set to a high value during the test time), which indicates to the clock phase selection module 160 that is should select the in-phase clock signal 132 (i.e., that is in-phase with the primary clock signal 122) as the sampling clock signal 162. By contrast, the corresponding binary value of the phase selection control signal 188 output by the finite state machine 180 is 01 when the phase counter value is two (2) (i.e., when two instances of the error detection output signal 198 were set to a high value during the test time), which indicates to the clock phase selection module 160 that is should select the quadrature-phase clock signal 134 (i.e., that is 90 degrees out-of-phase with the primary clock signal 122) as the sampling clock signal 162. As another example, the corresponding binary value of the phase selection control signal 188 is 10 when the phase counter value is three (3) (i.e., when three instances of the error detection output signal 198 were set to a high value during the test time), which indicates to the clock phase selection module 160 that is should select the first complementary clock signal 136 (i.e., that is complementary to the first in-phase clock signal 132 and 180 degrees out-of-phase with the primary clock signal 122) as the sampling clock signal 162. The corresponding binary value of the phase selection control signal 188 is 11 when the phase counter value is four (4) (i.e., when four instances of the error detection output signal 198 were set to a high value during the test time), which indicates to the clock phase selection module 160 that it should select the second complementary clock signal 138 (i.e., that is complementary to or 180 degrees out-of-phase with the first quadrature-phase clock signal 134, and is 270 degrees out-of-phase with the primary clock signal 122) as the sampling clock signal 162.

One of the plurality of clock signals 132/136, 134/138 will always have a phase that is substantially phase-aligned with the test data signal 142 and can thus be used to correctly sample the test data signal 142. Ideally, any clock phase can be used to correctly sample the received test data signal 142. However, phase and voltage noise at rising/falling edges of both the test data signal 142 and clock signals 132, 134, 136, 138, and the finite sensitivity of the sampling module 170, make it such that only the clock phases which are close to center of data eye can be used to correctly sample the received test data signal 142. To explain further, with reference to FIG. 2, each period (T) of the test data signal 142 includes a setup time (Tsu) of the sampling module 170 and a hold time (Thd) of the sampling module 170. So long as (1) the sum of the minimum setup time (Tsu_min) of the sampling module 170 and the minimum hold time (Thd_min) of the sampling module 170 is less than (2) three quarters of one bit unit interval (UI) of the data signal (or period (T) of the clock with frequency that is the same as the data rate) minus the data delay jitter (Ttxdj), an error free sampling window (i.e., that is greater than one quarter one bit UI in the presence of data delay jitter) will be provided such that one of the clock signals 132, 134, 136, 138 can be selected such that it will have a phase that is substantially phase-aligned with the test data signal 142.

The sampling module 170 uses the sampling clock signal 162 (having a phase that is substantially aligned with respect to the test data signal 142) to sample the test data signal 142 in accordance with the sampling clock signal 162. The appropriate sampling clock signal 162 helps ensure that the sampled test data signal 172 generated by the sampling module 170 (i.e., when the test data signal 142 is sampled per the sampling clock signal 162) is substantially phase-aligned with respect to the test data signal 142.

Figure 3:
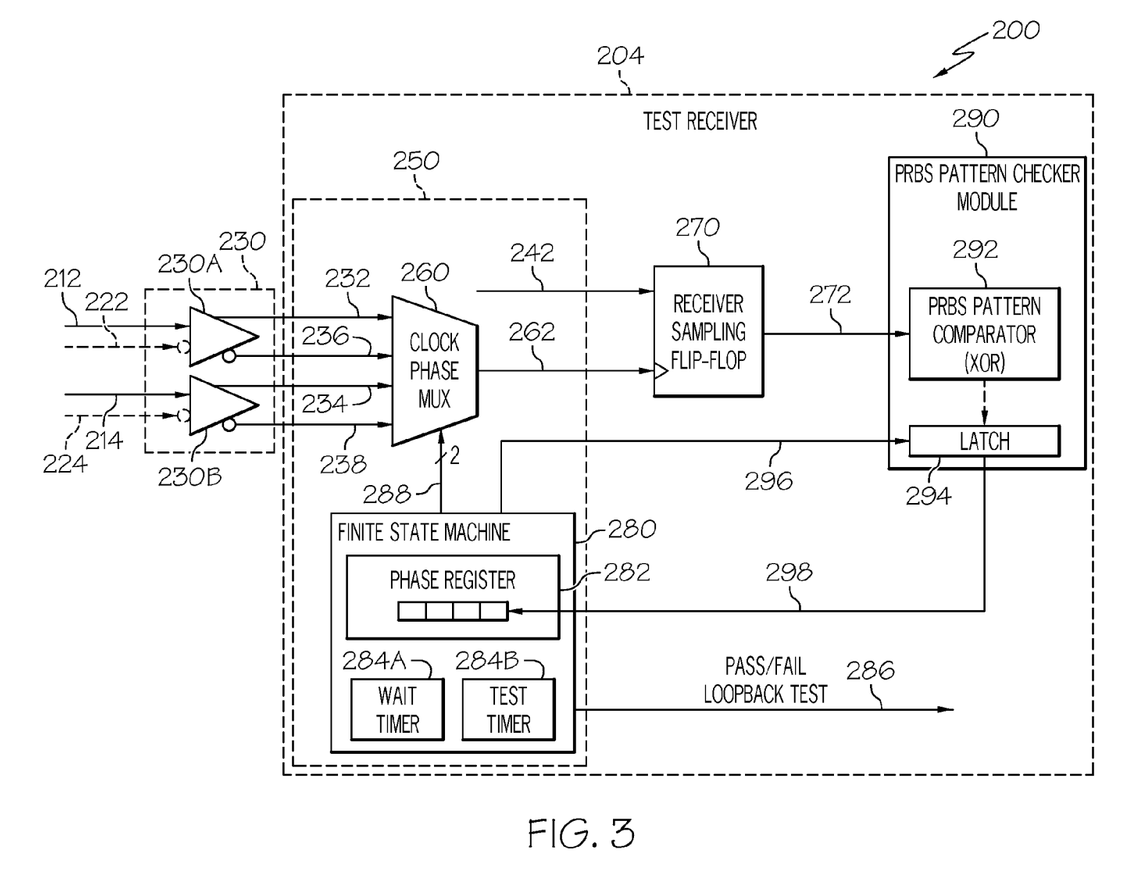
FIG. 3 is a block diagram of particular portions of an integrated circuit device that can be used to implement a loopback testing system of FIG. 1 in accordance with one exemplary implementation of some of the disclosed embodiments.

FIG. 3 is a block diagram of particular portions of an integrated circuit device 200 that can be used to implement a loopback testing system of FIG. 1 in accordance with one exemplary implementation of some of the disclosed embodiments.

In this exemplary implementation, the clock signal generator module 130 can be implemented using a phase locked loop (PLL) 230 that generates two pairs of clock signals 232/236 and 234/238. When viewed in a single-ended sense, the clock signals 232/236, 234/238 are four single-ended clock signals 232, 234, 236, 238, as illustrated in FIG. 2.

Although not illustrated in FIG. 3, the primary clock signal 122 of FIG. 1 can be divided into an in-phase retime clock signal 212 and a quadrature-phase retime clock signal 214. Then, as shown in FIG. 3, the phase locked loop (PLL) 230 uses an in-phase retime clock signal 212 and its complementary signal 222 to generate a first pair of complementary or differential clock signals that include a first in-phase clock signal 232 that is in-phase with the primary clock signal 122, and a first complementary or differential clock signal 236 that is 180 degrees out-of-phase with the primary clock signal 122. The phase locked loop (PLL) 230 uses the quadrature-phase retime clock signal 214 and its complementary signal 224 to generate a second pair of complementary or differential clock signals that include a first quadrature-phase clock signal 234 that is 90 degrees out-of-phase with the primary clock signal 122, and a second complementary or differential clock signal 238 that is 270 degrees out-of-phase with the primary clock signal 122 (and that is 180 degrees out-of-phase with the first quadrature-phase clock signal 234).

Referring again to FIG. 2, each period (T) of the test data signal 142 includes a setup time (Tsu) of the sampling module 270 and a hold time (Thd) of the sampling module 270. Since setup time (Tsu) and hold time (Thd) of the sampling module 270 is relative to data signal zero crossing, data delay jitter (Ttxdj) would add on to setup time (Tsu) and hold time (Thd). For instance, in the example illustrated in FIG. 2, the first quadrature-phase clock signal 234 (that is 90 degrees out-of-phase) and the differential clock signal 236 (that is 180 degrees out-of-phase) are at the worst case position relative to the eye. The first quadrature-phase clock signal 234 has the worst case setup time (Tsu) and the differential clock signal 236 has the worst case and hold time (Thd). The summation would be three quarters of one bit UI. So long as (1) the sum of the minimum setup time (Tsu_min) of the sampling module 270 and the minimum hold time (Thd_min) of the sampling module 270 is less than (2) three quarters of one bit UI minus the data delay jitter (Ttxdj), an error free sampling window (i.e., that is greater than one quarter one bit UI in the presence of data delay jitter) will be provided such that one of the clock signals 232, 234, 236, 238 can be selected such that it will have a phase that is substantially phase-aligned with the received test data signal 242 and can thus be used to correctly sample the received test data signal 242.

As in FIG. 1, the test receiver 204 includes a sampling module 270, an error detection module 290 and a clock phase alignment module 250.

In this particular implementation, clock phase alignment module 250 is implemented using a clock phase selection multiplexer circuit 260 and a finite state machine 280. As will be described in greater detail below, the clock phase selection multiplexer circuit 260 selects, based on a phase selection control signal 288 from the finite state machine 280, a particular one of the clock signals 232/236, 234/238 that has a phase that is substantially aligned with respect to the received test data signal 242 as a sampling clock signal 262 that is to be used to sample the received test data signal 242.

In this particular implementation, the sampling module 270 is implemented using a sampling flip-flop 270 that regularly samples the received test data signal 242 according to the sampling clock signal 262 from the clock phase alignment module 250 to generate a sampled test data signal 272, and outputs the sampled test data signal 272 that is substantially phase-aligned with respect to the received test data signal 242.

In this particular implementation, the known test data pattern of the test data signal is pseudo-random bit sequence (PRBS), such as a PRBS 7.0 pattern or a PRBS 10.0 pattern, generated by a pseudo random bit sequence (PRBS) generator module (not illustrated, but would correspond to module 110 of FIG. 1), and therefore the error detection module 290 is implemented as a PRBS pattern checker module 290 that includes a PRBS pattern comparator module 292 coupled to a latch 294.

In one implementation, the PRBS pattern comparator module 292 can be implemented using an exclusive OR logic (e.g., a XOR logic gate or software module). To detect bit errors, the PRBS pattern comparator module 292 compares each bit of the sampled test data signal 272 to a corresponding bit of a known PRBS (that is the same as the PRBS of the test data signal generated by PRBS generator module of the transmitter) to determine whether each bit of the sampled test data signal 272 matches the corresponding bit of the known test pattern or is in error.

As noted above, the number of bit errors that need to be detected (by the PRBS pattern comparator module 292) in order to unlatch the latch 294 and output the error detection output signal 298 varies depending on the implementation. For sake of simplicity, in the description that follows, it will be assumed that each time the PRBS pattern comparator module 292 determines that a bit error is present in the sampled test data signal 272, the latch 294 outputs an error detection output signal 298 (i.e., set the error detection output signal 298 high), which is then read the finite state machine 280. In other words, for any bit error that is detected by the PRBS pattern comparator module 292 when the sampled test data signal 272 is compared bit-by-bit to the PRBS, the latch 294 sets the error detection output signal 298 to a logic high, and the error detection output signal 298 of latch 294 will remain high until the latch 294 is reset. However, it is noted that this is simply one non-limiting implementation, and that in other implementations, the PRBS pattern comparator module 292 can detect more than one bit error before unlatching the latch 294 and setting the error detection output signal 298 to a logic high.

In some implementations, illustrated in FIG. 3, the finite state machine 280 generates the phase selection control signal 288 in response to the error detection output signal 298 as follows.

The finite state machine 280 maintains a phase register 282, a wait timer 284A, and a test timer 284B. The phase register 282 counts a number of clock phase selection changes that have been made. The wait timer 284A determines when the latch 294 should be cleared and reset after each change of phase register 282. The test timer 284B determines when the error detection output signal 298 will be read or sampled by the finite state machine 280 (i.e., when the test timer 284B expires). The length of the test timer 284B is programmable depending on test pattern being used and should be long enough such that whole length of test pattern can be received and compared to the known test pattern.

The value of a count at the phase register 282 determines the phase selection control signal 288 that will be output by the finite state machine 280. The value of the count at the phase register 282 is updated whenever the test timer 284B expires, and the finite state machine 280 automatically generates the phase selection control signal 288 based on the value of the count at the phase register 282 such that a corresponding one of the clock signals 232/236, 234/238 (and hence the current clock phase) will be selected by the clock phase selection multiplexer circuit 260 as the sampling clock signal 262. In other words, whenever the test timer 284B expires, the phase selection control signal 288 output by the phase register 282 will reflect the current value of the count at the phase register 282, and controls which one of the clock signals 232/236, 234/238 will be selected by the clock phase selection multiplexer circuit 260 as the sampling clock signal 262.

In one implementation, the value of the count at the phase register 282 can range from a value of one (1) up to four (4), where the value of the count represents the one of the clock signals 232/236, 234/238 (and hence the current clock phase) that is to be selected as the sampling clock signal 262.

In one implementation, as explained below with reference to Table 2, the finite state machine 280 generates the phase selection control signal 288 based on the 2-bit binary value stored in the phase register 282, which corresponds to the value of the count and to a particular one of the plurality of clock signals 232/236, 234/238.

Generating the Phase Selection Control Signal

In one exemplary implementation, the phase selection control signal 288 is two-bit binary control signal that can be used to select among four different phase settings, as specified in Table 2 below. It is noted that the correspondence between counter value (column 1) and the clock signal (column 3) can be arbitrarily set so long as each counter value (column 1) corresponds to a different clock signal having a different phase.

TABLE 2

| Count Value of Phase Register | Corresponding Binary Value of the Phase Selection Control Signal | Clock Signal (FIG. 3) That Is Output By Clock Phase Selection Multiplexer Circuit 260 |
| --- | --- | --- |
| 1 | 00 | 232 |
| 2 | 01 | 234 |
| 3 | 10 | 236 |
| 4 | 11 | 238 |

As shown in Table 2, the corresponding binary value of the phase selection control signal 288 output by the finite state machine 280 is 00 when the count value of the phase register 282 is one (1), which indicates to the clock phase selection multiplexer circuit 260 that is should select the in-phase clock signal 232 (i.e., that is in-phase with the primary clock signal 222) as the sampling clock signal 262. By contrast, the corresponding binary value of the phase selection control signal 288 output by the finite state machine 180 is 01 when the count value of the phase register 282 is two (2), which indicates to the clock phase selection multiplexer circuit 260 that is should select the quadrature-phase clock signal 234 (i.e., that is 90 degrees out-of-phase with the primary clock signal 222) as the sampling clock signal 262. As another example, the corresponding binary value of the phase selection control signal 288 is 10 when the count value of the phase register 282 is three (3), which indicates to the clock phase selection multiplexer circuit 260 that is should select the first complementary clock signal 236 (i.e., that is complementary to the first in-phase clock signal 232 and 180 degrees out-of-phase with the primary clock signal 222) as the sampling clock signal 262. The corresponding binary value of the phase selection control signal 288 is 11 when the count value of the phase register 282 is four (4), which indicates to the clock phase selection multiplexer circuit 260 that it should select the second complementary clock signal 238 (i.e., that is complementary to or 180 degrees out-of-phase with the first quadrature-phase clock signal 234, and is 270 degrees out-of-phase with the primary clock signal 222) as the sampling clock signal 262.

Loopback Test

At start of a loopback test, the finite state machine 280 resets a value of the count at the phase register 282 to one (1) via a reset signal 296, and resets the wait timer 284A via a reset signal (not shown), and then after the wait timer 284 expires, resets the state of the latch 294 and the test timer 284B to start the test timer 284B.

During the loopback test, each time the test timer 284B expires, the finite state machine 280 reads the state (e.g., high or low) the error detection output signal 298 from the latch 286 to determine whether bit errors were detected by the PRBS pattern comparator module 292 during the loopback test. As explained above, the error detection output signal 298 is "low" when no bit errors were detected by the PRBS pattern comparator module 292 during the loopback test, and is "high" when at least one bit error was detected by the PRBS pattern comparator module 292 during the loopback test.

If the error detection output signal 298 is low when the test timer 284B expires, then the finite state machine 280 will generate a signal 286 that indicates that the loopback test was successful or passed, and then exits the loopback test.

If the error detection output signal 298 is high when the test timer 284B expires, then the finite state machine 280 determines whether the value of the count at the phase register 282 greater than 3. If the value of the count at the phase register 282 is greater than 3, then the finite state machine 280 will generate a signal 286 that indicates that the loopback test failed to signal failure of the loopback test, and then exit the test. By contrast, if the value of the count at the phase register 282 is less than or equal to 3, then the finite state machine 280 will increment value of the count at the phase register 282, reset the wait timer 284A, and the loopback test continues.

The sampling flip-flop 270 samples the received test data signal 242 in accordance with the sampling clock signal 262 (that has a phase that is substantially aligned with the phase of the received test data signal 242). The appropriate sampling clock signal 262 helps ensure that the sampled test data signal 272 generated by the sampling flip-flop 270 (i.e., when the received test data signal 242 is sampled per the sampling clock signal 262) is substantially phase-aligned with respect to the received test data signal 242. As the processing performed at the test receiver 204 continues to loop, the accuracy of the tracking of the sampling clock signal 262 converges so that any phase error in the received test data signal 242 can be corrected by correctly selecting the correct one of the clock signals 232/236, 234/238 as the sampling clock signal 262.

In the embodiment illustrated in FIG. 3, a full-rate implementation is illustrated, where the sampling flip-flop 270 samples the received test data signal 242 in accordance with the sampling clock signal 262. However, in an alternative half-rate implementation, the sampling clock signal 262 that is output by the clock phase selection multiplexer circuit 260 can be divided into a half-rate sampling clock signal (not illustrated), and two sampling flip-flops 270 can then be used to sample the received test data signal 242 in accordance with the half-rate sampling clock signal using both the rising and falling edges to sample the received test data signal 242. Specifically, one of the sampling flip-flops 270 can then be used to sample the received test data signal 242 on the rising edge of the half-rate sampling clock signal, and the other one of the sampling flip-flops (not illustrated) can then be used to sample the received test data signal 242 on the falling edge of the half-rate sampling clock signal.

Figure 4:
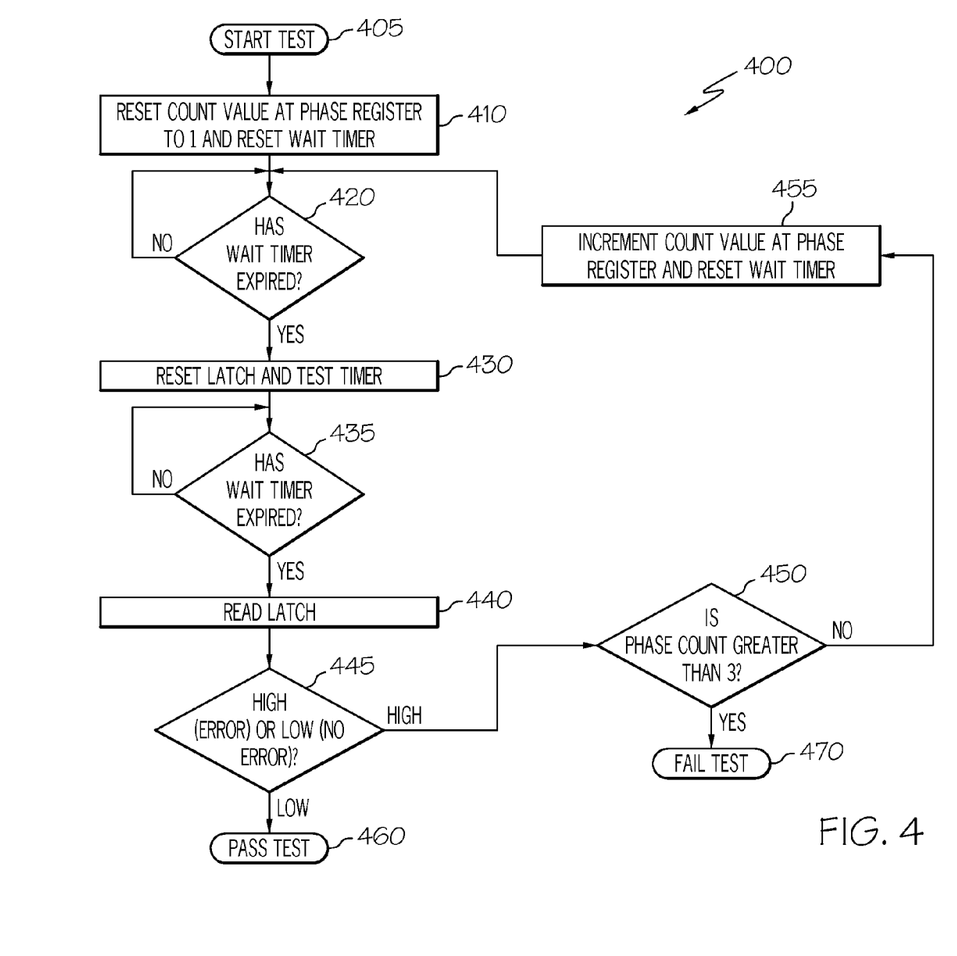
FIG. 4 is a flowchart that illustrates a loopback testing method in accordance with some of the disclosed embodiments.

FIG. 4 is a flowchart that illustrates a loopback testing method 400 for determining whether a loopback test was successful or unsuccessful in accordance with some of the disclosed embodiments. In one implementation, method 400 can be implemented at the test receiver 204 of FIG. 2.

The loopback testing method 400 begins when the loopback test starts at step 405. At step 410, the finite state machine 280 resets a value of the count at the phase register 282 to one (1) via a reset signal 296, and also resets the wait timer 284A via a reset signal (not illustrated).

At step 420, the finite state machine 280 determines whether the wait timer 284 has expired.

When the finite state machine 280 determines that the wait timer 284 has expired, the method proceeds to step 430, where the finite state machine 280 resets the state of the latch 294 to logic low, and resets the test timer 284B to start the test timer 284B.

At step 435, the finite state machine 280 determines whether the test timer 284B has expired.

When the finite state machine 280 determines that the test timer 284B has expired, the loopback testing method 400 proceeds to step 440, where the finite state machine 280 reads the latch 294, and then determines whether the error detection output signal 298 was set to logic low or logic high at step 445. During the loopback test, each time the test timer 284B expires, the finite state machine 280 reads the state (e.g., logic high or logic low) of the error detection output signal 298 from the latch 286 to determine whether bit errors were detected by the PRBS pattern comparator module 292 during the loopback test. As explained above, the error detection output signal 298 is "low" when no bit errors were detected by the PRBS pattern comparator module 292 during the loopback test, and is "high" when at least one bit error was detected by the PRBS pattern comparator module 292 during the loopback test.

When the finite state machine 280 determines (at step 445) that the error detection output signal 298 is set to logic low when the test timer 284B expires (e.g., no bit errors were detected), then at step 460 the finite state machine 280 will generate a signal 286 that indicates that the loopback test was successful or passed, and then exits the loopback test. When the finite state machine 280 determines (at step 445) that the error detection output signal 298 is set to logic low when the test timer 284B expires, this means that there is at least one of the clock signals 232/236, 234/238 that has a phase that is aligned and therefore the error detection output signal 298 remains in a low state, and therefore the finite state machine 280 signals 286 (at step 460) that the loopback test was successful to indicate that the transmitter 102 passed the loopback test.

By contrast, when the finite state machine 280 determines that the error detection output signal 298 was set to logic high (yes at step 445 when the test timer 284B expires), the loopback testing method 400 proceeds to step 450, where the finite state machine 280 determines whether the value of the count at the phase register 282 is greater than 3.

When the finite state machine 280 determines (at step 450) that the value of the count at the phase register 282 is less than or equal to the threshold (3), this means that error detection has not yet been performed with respect to all four of the clock signals 232/236, 234/238, and the loopback testing method 400 proceeds to step 455, where the finite state machine 280 increments the value of the count at the phase register 282 and resets the wait timer 284A. The loopback testing method 400 then loops back to step 420, where the loopback testing method 400 continues.

When the finite state machine 280 determines (at step 450) that the value of the count at phase register 282 is greater than the threshold (3), this means that the error detection output signal 298 was set to logic high when the loopback test was run with respect to all four of the clock signals 232/236, 234/238, and the loopback testing method 400 proceeds to step 470, where the finite state machine 280 will generate a signal 286 that indicates that the loopback test failed to signal failure of the loopback test, and then exit the test. In this scenario, because the error count is greater than 3, this means that all four of the possible clock phases have been tested without success, and there the finite state machine 280 signals 286 that the loopback test was unsuccessful to indicate that the transmitter 102 failed the loopback test.

Thus, the disclosed embodiments can provide a low-cost test receiver architecture that can be incorporated internally with a uni-directional physical layer device to enable internal loopback testing. In accordance with the disclosed embodiments, a plurality of clock signals (that each have a different phase and that are in quadrature with each other) can be generated, and a particular one of the clock signals that is substantially phase-aligned with the received test data signal can be selected as a sampling clock signal that is used to sample the test data signal. In this manner, the disclosed embodiments can align phase of the sampling clock with respect to the phase of the test data signal without the need for a clock recovery circuit even when there are device process variations, different operating data rates and different capacitive loading conditions. The received test data signal can then subsequently be sampled based on the sampling clock signal to generate a sampled test data signal that is substantially phase-aligned with respect to the received test data signal. In accordance with the disclosed embodiments, there is no need to limit data path round-trip delay variation or to tweak the delay in receiving clock path, and phase-alignment can be achieved regardless of testing data rate, modes of swings and test conditions to provide a highly robust transmitter loopback test.

While at least one exemplary embodiment has been presented in the foregoing detailed description, it should be appreciated that a vast number of variations exist. For example, in other implementations, the test receiver 104 of FIG. 1 can be implemented as an external module that is not part of the integrated circuit device, in which case the clock signal generator module 130 (e.g., PLL) would also need to be implemented externally instead of at the transmitter 102 of the integrated circuit device. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A loopback testing method, comprising:
receiving a test data signal and sampling the test data signal to generate a sampled test data signal;
generating an error detection output signal when a bit error is detected in the sampled test data signal when compared to a known test data pattern;
generating, based on one or more instances of the error detection output signal, a phase selection control signal, wherein a value of the phase selection control signal varies based on a number of instances of the error detection output signal that were generated within a test time;
selecting, based on the value of the phase selection control signal, a particular one of a plurality of clock signals as a sampling clock signal, wherein the plurality of clock signals each have a different phase and are in quadrature with each other, and wherein one of the plurality of clock signals has a phase that is substantially aligned with respect to a phase of the test data signal; and
sampling the test data signal based on the sampling clock signal to generate another sampled test data signal that is substantially phase-aligned with respect to the test data signal.

2. The method according to claim 1, further comprising:
generating a primary clock signal; and
generating a plurality of clock signals based on a primary clock signal, wherein each of the plurality of clock signals have a different phase and are in quadrature with each other, and wherein the plurality of clock signals, comprise:
a first pair of differential clock signals, comprising: a first in-phase clock signal that is in-phase with the primary clock signal and a first complementary clock signal that is complementary to the first in-phase clock signal and is 180 degrees out-of-phase with the primary clock signal, and
a second pair of differential clock signals, comprising: a first quadrature-phase clock signal that is 90 degrees out-of-phase with the primary clock signal, and a second complementary clock signal that is complementary to the first quadrature-phase clock signal and 180 degrees out-of-phase with the first quadrature-phase clock signal, and that is 270 degrees out-of-phase with the primary clock signal,
wherein one of the plurality of clock signals has a phase that is substantially phase-aligned with the test data signal.

3. The method according to claim 1, further comprising:
transmitting a test data signal over a uni-directional test data path, wherein the test data signal has a known test data pattern that is clocked in accordance with the primary clock signal;
and wherein receiving a test data signal and sampling the test data signal to generate a sampled test data signal comprises:
receiving the test data signal after transmission over the uni-directional test data path, and sampling the test data signal to generate a sampled test data signal.

4. The method according to claim 3, further comprising:
comparing each bit of the sampled test data signal to a corresponding bit of the known test data pattern to determine whether each bit of the sampled test data signal matches the corresponding bit of the known test data pattern.

5. The method according to claim 4, wherein generating an error detection output signal when a bit error is detected in the sampled test data signal when compared to the known test data pattern, comprises
when any bit of the sampled test data signal does not match a corresponding bit of the known test data pattern, determining that a bit error is present in the sampled test data signal and generating an error detection output signal.

6. The method according to claim 5, wherein generating, based on one or more instances of the error detection output signal, a phase selection control signal, comprises:
maintaining a test timer and a register;
reading a value of the error detection output signal whenever the test timer expires, and updating a value of a count at the register based on the value of the error detection output signal that is read whenever the test timer expires; and
generating the phase selection control signal based on the value of the count at the register, wherein a value of the phase selection control signal changes based on the value of the count at the register, and wherein the value of the phase selection control signal corresponds to a particular one of the plurality of clock signals that is to be selected as the sampling clock signal.

7. The method according to claim 1, wherein the test data pattern comprises: a pseudo-random bit sequence (PRBS), and further comprising:
generating the test data signal by clocking the pseudo random bit sequence (PRBS) according to the primary clock signal.

8. The method according to claim 1, wherein selecting, comprises:
receiving the plurality of clock signals; and
outputting, based on the phase selection control signal, the sampling clock signal, wherein the sampling clock signal is one of the plurality of clock signals having the phase that is substantially aligned with respect to the phase of the test data signal.

9. An integrated circuit device, comprising:
a transmitter to transmit a test data signal that comprises a known test data pattern that is clocked according to a primary clock signal; and
a test receiver to receive the test data signal after transmission over a uni-directional test data path, the test receiver comprising:
a sampling module to sample the test data signal to generate a sampled test data signal;
an error detection module to compare the sampled test data signal to a known test data pattern, and to generate an error detection output signal when a bit error is detected in the sampled test data signal in comparison to the known test data pattern;
a clock phase alignment module to receive the error detection output signal and a plurality of clock signals that are generated based on a primary clock signal, wherein each of the plurality of clock signals have a different phase and are in quadrature with each other, wherein the clock phase alignment module is configured to generate, based on the error detection output signal, a phase selection control signal, wherein a value of the phase selection control signal varies based on a number of instances of the error detection output signal that were generated within a test time, and wherein the clock phase alignment module is configured to select, based on a value of the phase selection control signal, a particular one of the plurality of clock signals as a sampling clock signal that is to be used to sample the test data signal, wherein the particular one of the plurality of clock signals that is selected has a phase that is substantially aligned with respect to a phase of the test data signal, and
wherein the sampling module is configured to sample the test data signal in accordance with the sampling clock signal to generate another sampled test data signal that is substantially phase-aligned with respect to the test data signal.

10. The integrated circuit device according to claim 9, wherein the clock phase alignment module comprises:
a finite state machine to generate a phase selection control signal, wherein a value of the phase selection control signal varies based on a number of instances of the error detection output signal that were generated within a test time; and
a clock phase selection module to receive the plurality of clock signals, and outputs, based on the value of the phase selection control signal, a sampling clock signal, wherein the sampling clock signal is one of the plurality of clock signals, wherein one of the plurality of clock signals has a phase that is substantially aligned with respect to the phase of the test data signal.

11. The integrated circuit device according to claim 10, wherein the value of the phase selection control signal is updated to cause the clock phase selection module to output a sampling clock signal that is the one of the plurality of clock signals having the phase that is substantially aligned with respect to the phase of the test data signal.

12. The integrated circuit device according to claim 11, wherein the finite state machine further comprises a test timer and a register, and wherein the finite state machine is to read a value of the error detection output signal whenever the test timer expires, and to update a value of a count at the register based on the value of the error detection output signal that is read when the test timer expires.

13. The integrated circuit device according to claim 12, wherein the finite state machine is to generate the phase selection control signal based on the value of the count at the register, wherein a value of the phase selection control signal changes based on the value of the count at the register, and wherein the value of the phase selection control signal corresponds to a particular one of the plurality of clock signals that is to be selected as the sampling clock signal.

14. The integrated circuit device according to claim 11, wherein the error detection module is to compare each bit of the sampled test data signal to a corresponding bit of the known test data pattern to determine whether each bit of the sampled test data signal matches the corresponding bit of the known test data pattern, and to communicate the error detection output signal to the finite state machine whenever a bit error is determined to be present in the sampled test data signal.

15. The integrated circuit device according to claim 9, wherein the sampling module comprises:
a sampling flip-flop to sample the test data signal according to the sampling clock signal, and to output the sampled test data signal that is substantially phase-aligned with respect to the test data signal.

16. The integrated circuit device according to claim 10, wherein the clock phase selection module comprises:
a clock phase selection multiplexer circuit.

17. The integrated circuit device according to claim 9, wherein the test data pattern comprises: a pseudo-random bit sequence (PRBS), and wherein the transmitter comprises:
a clock source to generate a primary clock signal;
a clock signal generator module to generate, based on the primary clock signal, the plurality of clock signals;
a pseudo random bit sequence (PRBS) generator module to generate the pseudo random bit sequence (PRBS); and
a transmitter data path module to generate the test data signal by clocking the pseudo random bit sequence (PRBS) according to the primary clock signal, and transmits the test data signal over the uni-directional test data path.

18. The integrated circuit device according to claim 17, wherein the clock signal generator module, comprises:
a phase locked loop (PLL).

19. The integrated circuit device according to claim 9, wherein the plurality of clock signals comprise:
a first pair of differential clock signals, comprising: a first in-phase clock signal that is in-phase with the primary clock signal and a first complementary clock signal that is complementary to the first in-phase clock signal and is 180 degrees out-of-phase with the primary clock signal, and a second pair of differential clock signals, comprising: a first quadrature-phase clock signal that is 90 degrees out-of-phase with the primary clock signal, and a second complementary clock signal that is complementary to the first quadrature-phase clock signal and 180 degrees out-of-phase with the first quadrature-phase clock signal, and that is 270 degrees out-of-phase with the primary clock signal wherein one of the plurality of clock signals has a phase that is substantially phase-aligned with the test data signal.

20. An integrated circuit device, comprising:
a transmitter, comprising:
    a phase locked loop (PLL) to generate a first pair of differential clock signals and a second pair of differential clock signals based on a primary clock signal, wherein each of the differential clock signals have a different phase and are in quadrature with each other; and
    a module to generate a test data signal comprising a known test data pattern that is clocked according to the primary clock signal; and
a test receiver to receive the test data signal after transmission over a transmitter data path and a uni-directional test data path, the test receiver comprising:
    a flip-flop to sample the received test data signal to generate a sampled test data signal;
    an exclusive OR (XOR) gate to compare each bit of the sampled test data signal to a corresponding bit of the known test data pattern;
    a latch, coupled to the exclusive OR (XOR) gate, to generate an error detection output signal whenever a bit error is detected in the sampled test data signal by the exclusive OR (XOR) gate;
    a finite state machine comprising a test timer, and a register, wherein the finite state machine is to reads a value of the error detection output signal whenever the test timer expires, to update a value of a count at the register based on the value of the error detection output signal that is read whenever the test timer expires, and to generate the phase selection control signal based on the value of the count at the register, wherein a value of the phase selection control signal changes based on the value of the count at the register, and wherein the value of the phase selection control signal corresponds to a particular one of the plurality of clock signals that is to be selected as the sampling clock signal; and
    a clock phase selection multiplexer circuit that, in response to the phase selection control signal, is to output a sampling clock signal that is the particular one of the plurality of clock signals, wherein one of the plurality of clock signals has a phase that is substantially aligned with respect to a phase of the received test data signal, and wherein the flip-flop samples the received test data signal in accordance with the sampling clock signal to generate a sampled test data signal that is substantially phase-aligned with respect to the received test data signal.

\* \* \* \* \*